(12) United States Patent
Afzali-Ardakani et al.

(10) Patent No.: US 8,481,413 B2
(45) Date of Patent: Jul. 9, 2013

(54) DOPING OF SEMICONDUCTOR SUBSTRATE THROUGH CARBONLESS PHOSPHOROUS-CONTAINING LAYER

(75) Inventors: Ali Afzali-Ardakani, Ossining, NY (US); Damon B. Farmer, White Plains, NY (US); Lidija Sekaric, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 485 days.

(21) Appl. No.: 12/721,727

(22) Filed: Mar. 11, 2010

(65) Prior Publication Data

US 2011/0223751 A1    Sep. 15, 2011

(51) Int. Cl.
*H01L 21/22*    (2006.01)

(52) U.S. Cl.
USPC ............ 438/558; 438/369; 438/526; 438/542

(58) Field of Classification Search
None
See application file for complete search history.

(56) References Cited

U.S. PATENT DOCUMENTS 3,767,434 A * 10/1973 Thomas .......................... 501/12
7,507,483 B2 * 3/2009 Schwartz et al. ............. 428/624

* cited by examiner

*Primary Examiner* — Zandra Smith
*Assistant Examiner* — Pamela E Perkins
(74) *Attorney, Agent, or Firm* — Scully, Scott, Murphy & Presser, P.C.; Vazken Alexanian

(57) ABSTRACT

A method and system are disclosed for doping a semiconductor substrate. In one embodiment, the method comprises forming a carbon free layer of phosphoric acid on a semiconductor substrate, and diffusing phosphorous from the layer of phosphoric acid in the substrate to form an activated phosphorous dopant therein. In an embodiment, the semiconductor substrate is immersed in a solution of a phosphorous compound to form a layer of the phosphorous compound on the substrate, and this layer of phosphorous is processed to form the layer of phosphoric acid. In an embodiment, this processing may include hydrolyzing the layer of the phosphorous compound to form the layer of phosphoric acid. In one embodiment, an oxide cap layer is formed on the phosphoric acid layer to form a capped substrate. The capped substrate may be annealed to diffuse the phosphorous in the substrate and to form the activated dopant.

25 Claims, 2 Drawing Sheets

BULK EMBODIMENT

SOI EMBODIMENT

DOPING OF SEMICONDUCTOR SUBSTRATE THROUGH CARBONLESS PHOSPHOROUS-CONTAINING LAYER

BACKGROUND OF THE INVENTION

1. Field of the Invention

This invention, generally, relates to semiconductor fabrication, and more specifically, to doping of semiconductor materials.

2. Background Art

Semiconductor devices are used in a wide variety of applications including diodes, photodetectors, photocells, transistors, and integrated circuits. Silicon and germanium are commonly used in such electronic devices. In particular, silicon is the most widely used material in semiconductor devices due to its low cost, relatively simple processing, and useful temperature range. Further, the electronic properties and behavior of silicon and germanium can be relatively easily controlled by the addition of doping elements, for example, in the manufacture of P-I-N and N-I-P diodes.

In a conventional practice, semiconductor fabrication begins with the provision of a semiconductor wafer, comprising silicon formed in a regular, crystalline structure. A circuit pattern is devised in which regions of the semiconductor wafer are intended to support NMOS and PMOS semiconductor components. These regions are isolated from each other with the formation of electronically inert isolation trenches. Each region is then doped with a type of dopant opposite the electronic nature of the components to be created thereupon. For instance, the dopant may be introduced through ion implantation, in which charged ions of the dopant material are fired at the semiconductor wafer at high speeds, thereby physically injecting them into the substrate. In the past, doping has also been achieved by utilizing conventional thermal diffusion in furnace, and Chemical or Physical Vapor Deposition (CVD, PVD), such as sputtering.

Following doping, electronic components are then formed upon the semiconductor wafer, which typically involves doping (via ion implantation or another suitable method) the electronically active areas of the semiconductor wafer with the desired type of dopant. For instance, NMOS components are formed by placing a p-type dopant in a region of the semiconductor, and then forming the components by placing an n-type dopant in order to create the electronically active regions of the NMOS component. Each dopant is exposed to a thermal anneal, which restores the crystalline lattice structure of the semiconductor wafer (since some physical placement processes, such as ion implantation, can disrupt the crystalline lattice), and also electronically "activates" the dopant ions by positioning them within the same lattice structure. The components may then be connected through a metallization step, in which metal paths are formed to connect the electronically active areas of the components into a fully interconnected circuit.

It will be appreciated that the placement of the dopant is a key step in semiconductor component fabrication. For many semiconductor components, the characteristics of doping, such as the choice of dopant, the placement method, and the resulting concentration and area of the dopant, dopant concentration vertical and lateral gradient, bear critically on the resulting performance and reliability of the components. One scenario, for example, that requires precise placement is in the formation of source/drain regions of a MOSFET transistor. A typical transistor comprises two electronically active areas that serve as the source and drain regions of the transistor, which are bridged by a gate. When the gate is powered above a certain threshold voltage, a conductive channel is formed between the source and drain regions to close the circuit; but when the gate is unpowered, the channel resists such electronic flow.

In this context, the characteristics of the source/drain region doping relate to the threshold voltage of the gate and the resistance of the channel in powered and unpowered states. If the dopant concentration is too low, or if the source and drain are too distant, the threshold voltage will be undesirably high. If the dopant concentration is too high, or if the source and drain regions are too close, the threshold voltage will be undesirably low, and the resistance in the unpowered state may be insufficient to prevent electron flow. With prior art techniques, it is extremely difficult to achieve uniform doping across a large substrate due to dose variation. In addition, it is difficult to control the doping profile.

In order to improve large scale integrated circuit (LSI) performance, the integrated density or miniaturization of the elements used to configure an LSI has been enhanced. In order to miniaturize elements, reduction in the area of an impurity diffusion region, as well as formation of a shallower diffusion region along the depth of the diffusion are required.

With miniaturization of silicon devices, controlled doping of the silicon devices either for contacts or channel materials becomes very important. The Standard approach for doping through high energy implantation sometimes produces problems like amorphization of the silicon. Another approach which has been reported in the literature is doping through self-assembly of phosphorous containing organic compounds on silicon and anneal the capped substrate at high temperatures. In this approach, although the extent of doping can be controlled, the presence of carbonaceous materials in the silicon results in diffusion of carbon in the silicon and formation of unwanted carbides.

BRIEF SUMMARY

Embodiments of the invention provide a method and system for doping a semiconductor substrate. In one embodiment, the method comprises forming a carbon free layer of phosphoric acid on a semiconductor substrate, and diffusing phosphorous from the layer of phosphoric acid in the substrate to form an activated phosphorous dopant therein. In an embodiment, the forming includes immersing the semiconductor substrate in a solution of a phosphorous compound to form a layer of the phosphorous compound on the substrate, and processing said layer of the phosphorous compound to form the layer of phosphoric acid. In an embodiment, the processing said layer of the phosphorous compound includes hydrolyzing said layer of the phosphorous compound to form the layer of phosphoric acid.

In one embodiment, the solution includes an anhydrous organic solvent; and the processing includes removing the substrate from the solution, and rinsing the substrate with said anhydrous organic solvent. In an embodiment, the immersing includes immersing the substrate in the solution in the presence of an organic base.

In one embodiment, the diffusing includes forming an oxide cap layer on the phosphoric acid layer to form a capped substrate. In an embodiment, the diffusing further includes annealing the capped substrate to diffuse the phosphorous in the substrate and to form the activated dopant therein. In an embodiment, the annealing includes heating the capped substrate in a rapid thermal anneal, and the oxide cap layer is between about 5 and 10 nms thick.

In one embodiment, carbonless, phosphorous-containing compounds are self-assembled on the native oxide of the silicon substrate from a dilute solution of phosphorous compounds in anhydrous organic solvents and then hydrolyzed with water to form a layer of phosphoric acid on the silicon substrate. After capping the monolayer with an oxide (e.g. ALD deposited aluminum oxide), the substrate is annealed at high temperature to drive the dopant into the silicon substrate.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

Figure 1:
FIG. 1 illustrates a bulk semiconductor substrate that may be used in an embodiment of the invention.
Figure 2:
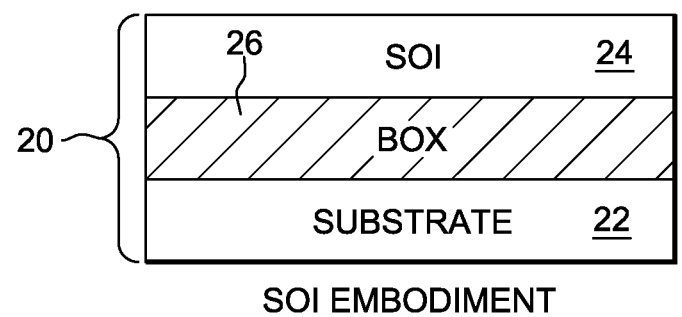
FIG. 2 shows a semiconductor-on-insulator that may be used in an embodiment of the invention.

FIGS. 1 and 2 show devices 10 and 20 that may be used in the present invention. Device 10 includes a bulk semiconductor material 14. Device 20 is a semiconductor-on-insulator material including semiconductor layers 22 and 24 and insulating layer 26.

With reference to FIG. 1, substrate 10 typically is Si although other suitable semiconductor materials may be used. For example, SiC, SiGe, SiGeC, Si alloys, Ge, Ge alloys, GaAs, InAs, and InP, as well as other III/V and II/VI compound semiconductors, may be used.

With reference to FIG. 2, semiconductor layers 22 and 24 also typically are Si, although other suitable semiconductor materials may be used. For example, SiC, SiGe, SiGeC, Si alloys, Ge, Ge alloys, GaAs, InAs, and InP, as well as other III/V and II/VI compound semiconductors, may be used. The SOI wafer 20 may be a thick SOI wafer with SOI thickness in the 30-90 nm range, or it may be a thin SOI wafer with SOI thickness in the 15-30 nm range. For the case of a thick SOI starting wafe, SOI thinning may be performed to reduce the SOI thickness down to the 15-30 nm range using, as an example, an oxidation and hydrofluoric acid (HF) wet etch, as is well known.

The dielectric layer 26 present in device 20 may be formed in any suitable way. For instance, layer 26 may be formed by implanting a high-energy dopant into the substrate 22 and then annealing the structure to form a buried insulating layer, i.e., dielectric layer 26. In another embodiment, the dielectric layer 26 may be deposited or grown prior to the formation of the silicon layer 22. In yet another embodiment, the substrate 26 may be formed using wafer-bonding techniques, where a bonded wafer pair is formed utilizing glue, adhesive polymer, or direct bonding.

The present invention, as mentioned above, provides a method and system for doping a semiconductor substrate. In one embodiment, the method, generally, comprises forming a carbon free layer of phosphoric acid on a semiconductor substrate, and diffusing phosphorous from the layer of phosphoric acid in the substrate to form an activated phosphorous dopant therein. In an embodiment, the forming includes immersing the semiconductor substrate in a solution of a phosphorous compound to form a layer of the phosphorous compound on the substrate, and processing said layer of the phosphorous compound to form the layer of phosphoric acid. In an embodiment, the processing said layer of the phosphorous compound includes hydrolyzing said layer of the phosphorous compound to form the layer of phosphoric acid.

Generally, in an embodiment, carbonless, phosphorous-containing compounds are self-assembled on the native oxide of the silicon substrate from a dilute solution of phosphorous compounds in anhydrous organic solvents and then hydrolyzed with water to form a layer of phosphoric acid on the silicon substrate. After capping the monolayer with an oxide (e.g. ALD deposited aluminum oxide), the substrate is annealed at high temperature to drive the dopant into the silicon substrate.

Figure 3:
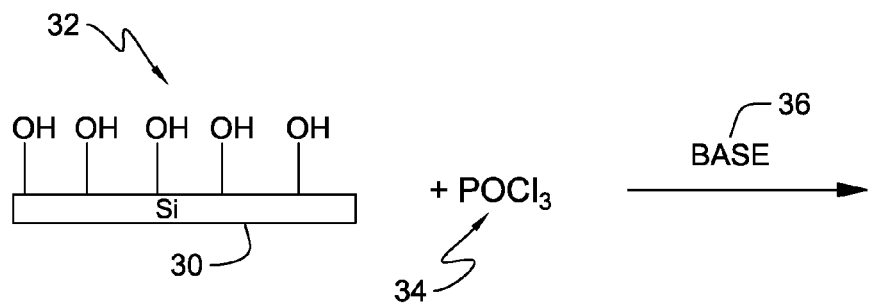
FIG. 3 represents the immersion of a silicon substrate in a solution of a phosphorous compound.
Figure 4:
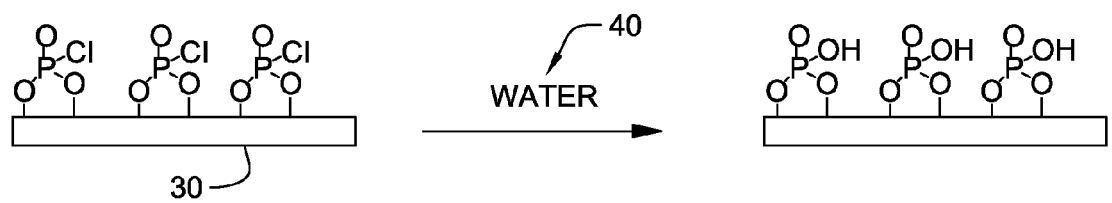
FIG. 4 illustrates a phosphorous monolayer on the substrate.

With reference to FIG. 3, self-assembly of phosphorous-containing compounds is achieved by immersing a silicon substrate 30 with native oxide 32 in a solution of phosphorous compound 34 (like phosphorous oxychloride or phosphorous trichloride) in an anhydrous organic solvent (THE, Toluene, hexane) in the presence of an organic base 36 (triethylamine, trimethylcollidine). As represented in FIG. 4, after the substrate 30 is removed from the solution, it is rinsed in the same anhydrous organic solvent and then hydrolyzed with water 42. This results in a monolayer 44 of a phosphorous compound on the surface of the semiconductor substrate 30.

Figure 5:
FIG. 5 shows the formation of an oxide cap layer on the phosphorous monolayer and annealing of the capped substrate.

With reference to FIGS. 4 and 5, after drying, a very thin layer (5-10 nm) of an oxide) aluminum or hafnium oxide) is deposited through an atomic layer deposition (ALD) method 52 to cap the monolayer 44. Then, the capped substrate is heated in rapid thermal anneal 56 under nitrogen or argon (from 750 C to 1100 C) to diffuse the phosphorous atoms in the silicon oxide and activate the dopant, as represented at 56.

In another embodiment, a multilayer of phosphorous-containing compounds is deposited on the surface of oxide by repeating the first and second reactions of FIGS. 3 and 4 as many time as is needed, followed by capping and annealing.

Any suitable phosphorous compound may be used in the present invention, and, for instance, phosphorous oxychloride or phosphorous trichloride may be used. Likewise, any appropriate anhydrous organic solvent may be used. For example, the organic solvent may be THF, Toluene, or hexane. The oxide deposited on the silicon may, as indicated above, be aluminum or hafnium oxide, although other suitable oxides may also be employed. Any appropriate procedure may be utilized to deposit the oxide, and, for instance, this may be done by atomic layer deposition. Similarly, any suitable annealing process, such as a rapid thermal anneal, may be employed to anneal the capped substrate and to diffuse the phosphorous in the silicon oxide.

While it is apparent that the invention herein disclosed is well calculated to fulfill objects discussed above, it will be appreciated that numerous modifications and embodiments may be devised by those skilled in the art, and it is intended that the appended claims cover all such modifications and embodiments as fall within the true spirit and scope of the present invention.

What is claimed is:

1. A method of doping a semiconductor substrate, comprising:
   forming a carbon free monolayer of phosphoric acid on a semiconductor substrate; and
   diffusing phosphorous from the monolayer of phosphoric acid in the substrate to form a phosphorous dopant therein, and activating said phosphorous dopant.

2. The method according to claim 1, wherein:
   the forming includes forming a self-assembled layer of a phosphorous compound on the semiconductor substrate; and
   processing said layer of the phosphorous compound to form the monolayer of phosphoric acid.

3. The method according to claim 2, wherein the processing said layer of the phosphorous compound includes hydrolyzing said layer of the phosphorous compound to form the monolayer of phosphoric acid.

4. The method according to claim 2, wherein:
   the forming includes immersing the semiconductor substrate in a solution of a phosphorous compound to form a layer of the phosphorous compound on the substrate; and
   the solution includes an anhydrous organic solvent.

5. The method according to claim 4, wherein the processing includes:
   removing the substrate from the solution; and
   rinsing the substrate with said anhydrous organic solvent.

6. The method according to claim 2, wherein the immersing includes immersing the substrate in the solution in the presence of an organic base.

7. The method according to claim 1, wherein the diffusing includes forming an oxide cap layer on the monolayer of phosphoric acid to form a capped substrate.

8. The method according to claim 7, wherein the diffusing further includes annealing the capped substrate to diffuse the phosphorous in the substrate and to form the activated dopant therein.

9. A method of doping a semiconductor substrate, comprising:
   forming a carbon free layer of phosphoric acid on a semiconductor substrate; and
   diffusing phosphorous from the layer of phosphoric acid in the substrate to form an activated phosphorous dopant therein;
   wherein the diffusing includes forming an oxide cap layer on the phosphoric acid layer to form a capped substrate, and annealing the capped substrate to diffuse the phosphorous in the substrate and to form the activated dopant therein; and
   wherein the annealing includes heating the capped substrate in a rapid thermal anneal.

10. The method according to claim 7, wherein the oxide cap layer is between about 5 and 10 nms thick.

11. A method of doping a semiconductor substrate through self-assembly of carbonless, phosphorous-containing monolayer, the method comprising:
   immersing the semiconductor substrate in a solution of a phosphorous compound to form a monolayer of a phosphorous compound on the substrate; and
   hydrolyzing said monolayer of the phosphorous compound to form a monolayer of phosphoric acid;
   forming an oxide cap layer on the monolayer of phosphoric acid to form a capped substrate; and
   annealing the capped substrate to diffuse phosphorous from the monolayer of phosphoric acid in the substrate and to form a phosphorous dopant therein, and activating said phosphorous dopant.

12. The method according to claim 11, wherein the solution includes an anhydrous organic solvent.

13. The method according to claim 12, further comprising:
   removing the substrate from the solution; and
   rinsing the substrate with said anhydrous organic solvent.

14. The method according to claim 11, wherein the immersing includes immersing the substrate in the solution in the presence of an organic base.

15. The method according to claim 11, wherein:
   the oxide cap layer is between about 5 and 10 nms thick; and
   the annealing includes heating the capped substrate in a rapid thermal anneal.

16. A system for doping a semiconductor substrate, comprising:
   a first subsystem for forming a carbon free monolayer of phosphoric acid on a semiconductor substrate; and
   a second subsystem for diffusing phosphorous from the monolayer of phosphoric acid in the substrate to form a phosphorous dopant therein, and activating said phosphorous dopant.

17. The system according to claim 16, wherein the first subsystem includes:
   a solution of a phosphorous compound, and wherein the semiconductor substrate is immersed in said solution to form the layer of the phosphorous compound on the substrate; and
   a processing subsystem to process said layer of the phosphorous compound to form the monolayer of phosphoric acid.

18. The system according to claim 17, wherein in the processing subsystem, said layer of the phosphorous compound is hydrolyzed to form the monolayer of phosphoric acid.

19. The system according to claim 16, wherein the solution includes an anhydrous organic solvent.

20. The system according to claim 16, wherein substrate is immersed in the solution in the presence of an organic base.

21. A system for doping a semiconductor substrate through self-assembly of carbonless, phosphorous-containing monolayer, the system comprising:
   a solution of a phosphorous compound, wherein the semiconductor substrate is immersed in the solution to form a monolayer of a phosphorous compound on the substrate; and
   a processing subsystem for hydrolyzing said monolayer of the phosphorous compound to form a monolayer of phosphoric acid, for forming an oxide cap layer on the phosphoric acid layer to form a capped substrate, and for annealing the capped substrate to diffuse phosphorous from the monolayer of phosphoric acid in the substrate to form a phosphorous dopant therein, and activating said phosphorous dopant.

22. The system according to claim 21, wherein the solution includes an anhydrous organic solvent.

23. The system according to claim 22, wherein in said processing subsystem, the substrate is rinsed with said anhydrous organic solvent.

24. The system according to claim 21, wherein the substrate is immersed in the solution in the presence of an organic base.

25. The system according to claim 21, wherein:
the oxide cap layer is between about 5 and 10 nms thick; and
the annealing includes heating the capped substrate in a rapid thermal anneal.

\* \* \* \* \*